United States Patent
Kuroda et al.

(10) Patent No.: US 7,723,794 B2
(45) Date of Patent: May 25, 2010

(54) LOAD DRIVING DEVICE

(75) Inventors: Toshikazu Kuroda, Tokyo (JP);
Hirokazu Hayashi, Tokyo (JP);
Yasuhiro Fukuda, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 882 days.

(21) Appl. No.: 11/516,752

(22) Filed: Sep. 7, 2006

(65) Prior Publication Data

US 2007/0052033 A1 Mar. 8, 2007

(30) Foreign Application Priority Data

Sep. 8, 2005 (JP) .............................. 2005-260053

(51) Int. Cl.
*H01L 23/62* (2006.01)

(52) U.S. Cl. .............................. 257/360; 257/E27.004; 436/135

(58) Field of Classification Search ................. 257/360, 257/E27.004; 438/135
See application file for complete search history.

(56) References Cited

U.S. PATENT DOCUMENTS 6,608,744 B1 * 8/2003 Kato ........................... 361/111

FOREIGN PATENT DOCUMENTS

| JP | 08-330521 | 12/1996 |
|---|---|---|
| JP | 11-274404 | 10/1999 |
| JP | 3386042 | 1/2003 |
| JP | 3526853 | 2/2004 |
| JP | 2004-071991 | 3/2004 |

* cited by examiner

*Primary Examiner*—Thao X Le
*Assistant Examiner*—Matthew Gordon
(74) *Attorney, Agent, or Firm*—Volentine & Whitt, P.L.L.C.

(57) ABSTRACT

A load driving device includes a drive control signal generation circuit generating a load drive control signal and a semiconductor buffer circuit generating an output signal in response to the load drive control signal. The buffer circuit has a pair of gate driven switching elements which are connected to each other in push-pull configuration and driven at their gate terminals by the load drive control signal. The buffer circuit has an output terminal which is connected to a connection point between ends of controlled electrodes of the gate driven switching elements, and a power source terminal and a ground connection terminal respectively connected to the remaining ends of the other controlled electrodes of the gate driven switching elements. A ground connection side element of a pair of gate driven switching elements has a set of MOS transistors which are connected across the connection point and the ground connection terminal.

10 Claims, 2 Drawing Sheets

LOAD DRIVING DEVICE

BACKGROUND OF THE INVENTION

1. Field of the Invention

The present invention relates to a load driving device, and particularly to a load driving device which protects a high withstand voltage MOS transistor from ESD (Electro Static Discharge).

2. Description of the Related Art

FIG. 1 of the accompanying drawings is a circuit diagram representing a conventional load driving device. The load driving device has a power source pad 1 and a ground connection pad 2. The power source pad 1 and the ground connection pad 2 are connected to a power source line 3 and a ground connection line 4, respectively. An internal circuit 5 i.e., a load drive signal generator that performs logical calculation operations, is connected between the power source line 3 and the ground connection line 4. An output signal node SO of the internal circuit 5 is connected to a gate of a P-channel type MOS transistor 6 (called 'PMOS' hereinbelow) and a gate of an N-channel type MOS transistor 7 (called 'NMOS' hereinbelow) that constitutes an output buffer. The PMOS 6 and the NMOS 7 which are gate driven switching elements constitute an inverter having a push-pull configuration. Sources of the PMOS 6 and the NMOS 7 are connected to the power source line 3 and the ground connection line 4, respectively. A drain of the PMOS 6 functioning as an output node NO is connected through a protection resistor 11 to the drain of the NMOS 7, and connected through a protection resistor 12 to an output pad 8.

An anode and a cathode of a protection diode 13 are connected to the output pad 8 and the power source line 3, respectively. An anode and a cathode of a protection diode 14 are connected to the ground connection line 4 and the output pad 8, respectively. An NMOS 15 is connected between the power source line 3 and the ground connection line 4 so that the NMOS 15 performs a protection function between the power sources by its diode characteristic in a reverse direction. Such transistor is called as a power clamp transistor.

When an electrostatic surge which is higher than a power source voltage VDD is supplied to the output pad 8 in the load driving device having such a protection circuit, a magnitude of electric potential of the power source line 3 rises to a potential which is roughly equal to an electric potential of the output pad 8 because of an operation of a protection diode in a forward direction. Since, at this moment, a magnitude of voltage between the output pad 8 and the power source line 3 is limited by property of the protection diode 13 in the forward direction, an electrostatic breakdown of the PMOS 6 is avoided. When a magnitude of electric potential of the output pad 8 further rises to a higher potential by the electrostatic surge, a protection diode 14 and the NMOS 15 that performs a protection operation between the power and ground lines fall into breakdown, so that a magnitude of voltage of the output pad 8 and the ground connection line 4 drops rapidly. A magnitude of electric potential of the output pad 8 rises until the protection diode 14 or the NMOS 15 falls into breakdown. However, an electrostatic breakdown of the NMOS 7 can be avoided because a current flowing through the NMOS 7 is limited by the protection resistors 11 and 12 that are inserted in series to each other between the output pad 8 and the ground connection line 4. When an electrostatic surge that is lower than the ground potential is supplied to the output pad 8, an electrostatic breakdown of the PMOS 6 and the NMOS 7 can be avoided by the protection diode 14 which is biased forwardly and the protection resistors 11 and 12.

Load driving devices which are known, for example, are disclosed in Japanese Laid Open No. 2004-71991, Japanese Laid Open No. H8-330521, Japanese Laid Open No. H11-274404, Japanese Patent No. 3386042, and Japanese Patent No. 3526853.

When an electrostatic surge is supplied across the output pad 8 and the ground connection pad 2, two surge current paths are formed. One of them is a path from the output pad 8 through the protection diode 13, the power source line 3, the NMOS 15, and the ground connection line 4, up to the ground pad 2. The other is a path from the output pad 8 via the protection resistor 12, the protection resistor 11, the NMOS 7 and the ground connection line 4, up to the ground pad 2. Even though, the NMOS 15 has a characteristic which is similar to the NMOS 7, a breakdown of the NMOS 7 in the second surge current path may occur earlier, because an impedance of the power source line 3 and the ground connection line 4 in the first surge current path is large.

Thus, a value of the protection resistor 12 inserted between the output node NO and the output pad 8 must be so large that a current flowing through the NMOS 7 in the case of a breakdown of the NMOS 7 becomes smaller than the breakdown proof current. When, for example, a load circuit such as an organic electroluminescence display which is current drive-type circuit is connected to the conventional load driving device, a voltage drop appears across the protection resistor 12. Therefore, it is necessary to select a high power source voltage which necessitates usage of costly semiconductor devices. Further the protection resistor 12 consumes a useless power.

When a load circuit such as an organic electroluminescence display is driven at a voltage of, for example, 20 V or higher, it is necessary to use a high voltage proof MOS transistor in an output circuit. However, a magnitude of breakdown proof current against an electrostatic surge current closely relates to a gate width of the high voltage proof MOS transistor. Thus the gate width becomes huge to realize a necessary magnitude of breakdown proof current, and occupies a wide area of the element.

SUMMARY OF THE INVENTION

An object of the present invention is to provide a load driving device which can suppress a voltage drop across a protection resistor and power consumption of the protection resistor and can efficiently protect itself from an electrostatic surge applied thereto.

According to one aspect of the present invention, there is provided a load driving device that includes a drive control signal generation circuit generating a load drive control signal and a semiconductor buffer circuit generating an output signal in response to the load drive control signal.

The buffer circuit has a pair of a gate driven switching elements which are connected to each other in push-pull configuration and driven at their gate terminals by the load drive control signal. The buffer circuit has an output terminal which is connected to a connection point between ends of controlled electrodes of the gate driven switching elements, and a power source terminal and a ground connection terminal respectively connected to remaining ends of the other controlled electrodes of the gate driven switching elements.

A ground connection side element of the pair of gate driven switching elements has a set of MOS transistors which are connected to each other across the connection point and the ground connection terminal.

The ground connection side element has a resistor element connected to the controlled electrode of the set of MOS transistor in series.

The set of MOS transistors includes a plurality of N-channel type MOS transistor formed on the same substrate.

The drive control signal generation circuit is connected between a power source line and a ground connection line which are connected to the power source terminal and the ground connection terminal, respectively.

A load driving device further includes a power source protection circuit which is juxtaposed with the drive control signal generating circuit across the power source line and the ground connection line.

DETAILED DESCRIPTION OF THE INVENTION

Drawings are used for easier understanding of the invention, and do not limit the invention.

Figure 1:
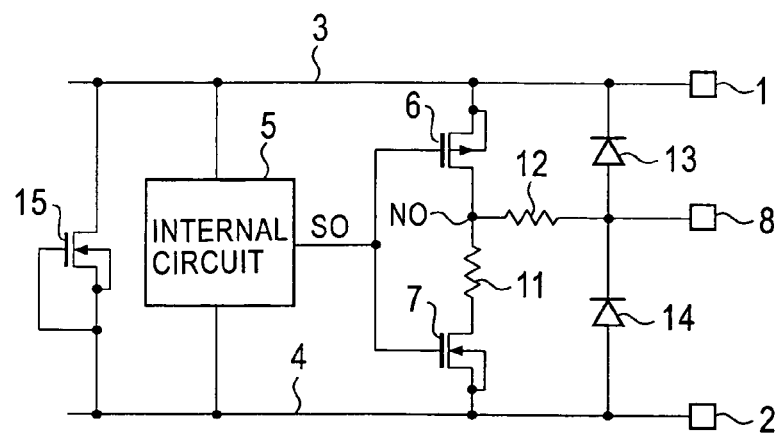
FIG. 1 is a circuit diagram showing a conventional load driving device.
Figure 2:
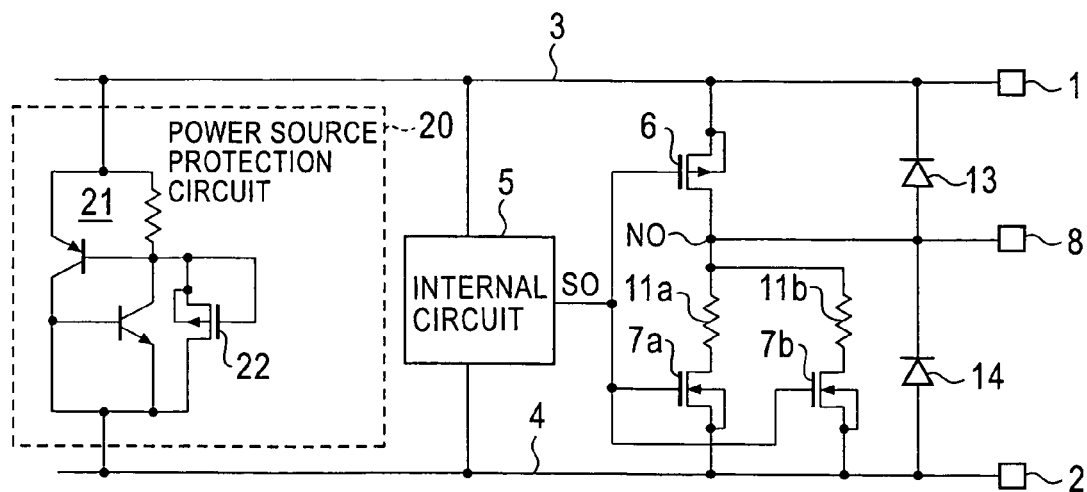
FIG. 2 is a circuit diagram showing a load driving device of an embodiment according to the present invention.

FIG. 2 is a circuit diagram showing a load driving device of the invention, and similar reference numerals and symbols are used in FIG. 1 and FIG. 2.

The load driving device includes a power source pad 1 and a ground connection pad 2. These power source pad 1 and ground pad 2 are connected to a power source line 3 and a ground connection line 4, respectively. An internal circuit 5 i.e., load drive signal generator that performs logical calculation operations which operates logical process, is connected between the power source line 3 and the ground connection line 4. An output signal node SO of the internal circuit 5 is connected to a gate of a PMOS 6, and gates of an NMOS 7a and NMOS 7b, which constitute an output buffer. The PMOS 6, the NMOS 7a and the NMOS 7b constitute an inverter. Sources of the PMOS 6, NMOS 7a and NMOS 7b are connected to the power source line 3 and the ground connection line 4, respectively. A drain of the PMOS 6 that is an output node NO which is connected to an output pad 8, and also connected to a drain of the NMOS 7a and the NMOS 7b through a protection resistors 11a and 11b. In this embodiment, the protection resistor 11a has a resistance value which is equal to a resistance value of the protection resistor 11b.

The NMOS 7a and 7b may be high withstand voltage transistors each having an active layer of offset construction which is formed on an N+ diffusion area in an N– diffusion layer.

It can be said that a conventional circuit constituted by the NMOS 7 and the resistor 11 in the circuit FIG. 1 is substituted for a new circuit including a first series of NMOS 7a and a resistor 11a and a second series of NMOS 7b and a resistor 11b. If the conventional circuit and the new circuit are equivalent to each other, each of the NMOSs 7a and 7b have a gate width which is a half of that of NMOS 7 and furthermore the resistor 11a and 11b have the same resistance value which is a double of that of the resistor 11. In this embodiment, the NMOS 7a has a gate width equal to a gate width of the NMOS 7b.

An anode and a cathode of a protection diode 13 are connected to the output pad 8 and the power source line 3, respectively. An anode and a cathode of a protection diode 14 are connected to the ground connection line 4 and the output pad 8, respectively.

A power source protection circuit 20 (also called as a power clamp circuit) is connected between the power source line 3 and the ground connection line 4, which protects these circuits by a thyristor switching characteristic realized by a set of a thyristor 21 and a PMOS 22.

Several embodiments of the power source protection circuit 20 are further described in commonly assigned U.S. patent application Ser. No. 110/355,190 filed Jan. 31, 2003, now U.S. Pat. No. 7,102,863, entitled, "Electrostatic Breakdown Preventing Circuit for Semiconductor Device" by Fukuda, which is incorporated herein by reference. This U.S. patent application is Japanese counterpart patent application of Japanese Patent No. 3526853 as described above.

Figure 3A:
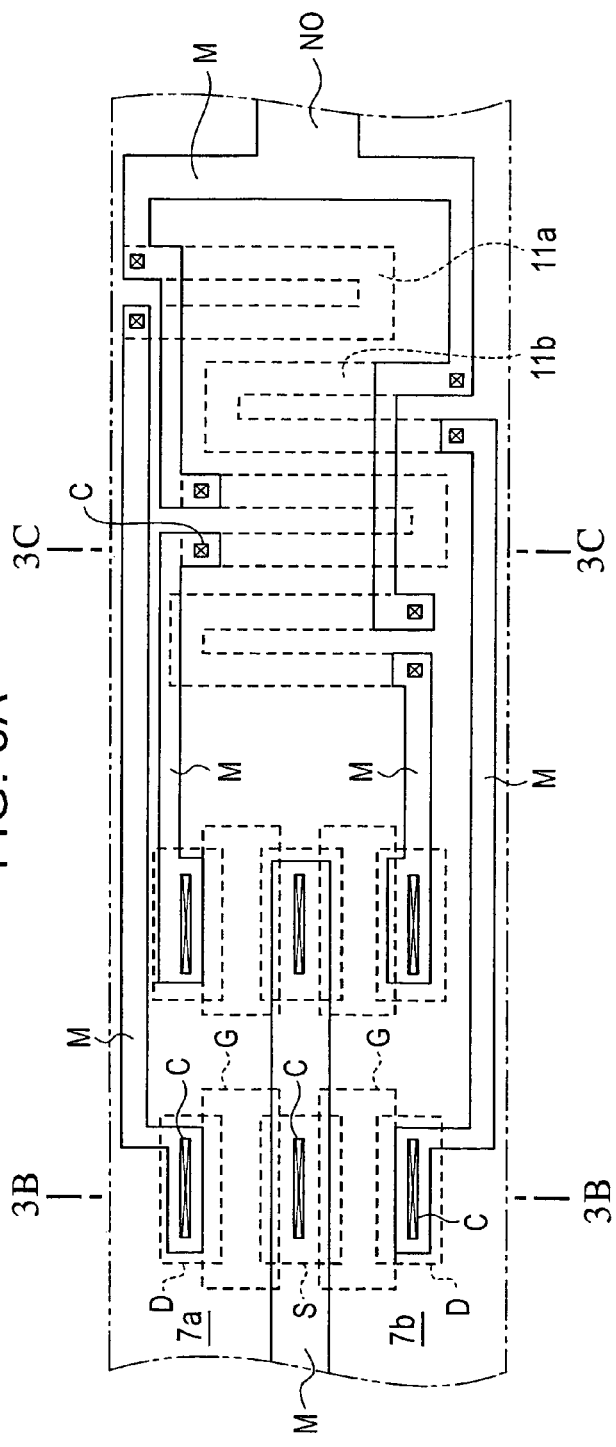
FIG. 3A is a layout diagram showing an output buffer illustrated in FIG. 2.
Figure 3C:
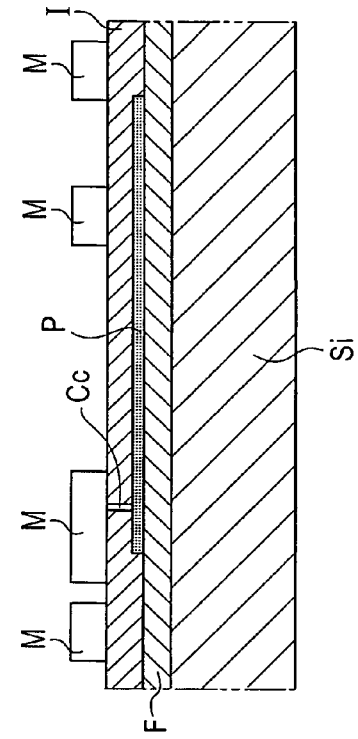
FIG. 3C is a cross-sectional view of the layout of FIG. 3A taken along the line 3C-3C.

FIG. 3A is a layout diagram showing a layout example formed in a semiconductor substrate of the output buffer illustrated in FIG. 2. FIG. 3A is plan view of the layout, and FIGS. 3B, and 3C are cross-sectional views taken along the lines 3B-3B and 3C-3C, respectively.

The output buffer is, for example, configured as an IC mounted on a semiconductor substrate as seen from FIG. 3A. This IC includes two series circuits which are connected between the output terminal NO and the ground connection line 4 and have respectively series connections of the NMOS 7a, 7b and the protection resistors 11a, 11b. A transistor formation area and a resistor formation area are respectively disposed at left and right sides of the substrate as seen from FIG. 3A.

Figure 3B:
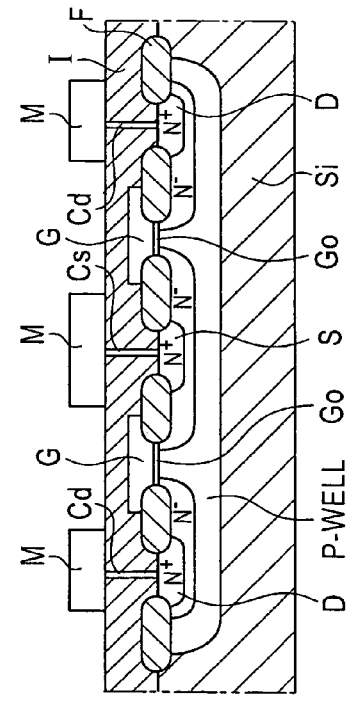
FIG. 3B is a cross-sectional view of the layout of FIG. 3A taken along the line 3B-3B.

As shown in FIG. 3B, the NMOS 7a and the NMOS 7b are formed in a p-well area defined in a silicon substrate Si. A drain D, a source S and a gate of the NMOS 7a and the NMOS 7b are partitioned by field oxide films F. The drain D and the source S i.e., active areas, have respectively offset constructions each of which is formed by an N+ diffusion area within a deep N– diffusion area. The NMOS 7a and the NMOS 7b have high withstand voltage characteristics because of depletion layers extending along boundaries between N– diffusion areas and p-well areas. The gate D is formed on a thick gate oxide film Go which extends on the p-well and between the drain D and the source S.

An interconnect insulation film I is formed on the drain D, the source S and the gate G. A wiring pattern layer M is formed on the interconnect insulation film I. The N+ diffusion areas of the drain D and the source S are electrically connected to the wiring pattern layer M via contacts Cd and Cs respectively which pass at pre-selected positions through the interconnect insulation film I.

As shown in FIG. 3C, the protection resistors 11a and 11b, are formed by mounting a polysilicon film P on the field oxide film F which is formed on the silicon substrate Si. The interconnect insulation film I which covers the transistor formation area further covers the polysilicon film P. The metallic wiring pattern M on the interconnect insulation film I overlies the film P. The polysilicon film P which includes the protection resistors 11a and 11b is electrically connected to the wiring pattern M via a contact Cc which passes at a preselected position through the interconnect insulation film I.

The load driving device of this embodiment operates in response to an electrostatic surge which is supplied to an output pad 8 as will be mentioned in the following.

When a positive electrostatic surge which is positive relative to that at the ground connection pad 2 is supplied to the output pad 8, the positive electrostatic surge is supplied to series circuits each including a protection resistor 11$x$, and a NMOS 7$x$ (where, x represents a, b) through a node NO. The positive electrostatic surge is further supplied to the power source protection circuit 20 via the power source line 3 and the protection diode 13, which is forward driven by the surge.

When the positive electrostatic surge rises up, the power source protection circuit 20 breaks down earlier than the NMOS 7$x$. In other words, when a breakdown of the PMOS 22 occurs, a potential of a gate of the thyristor 21 becomes equal to the ground potential so that this thyristor 21 becomes 'on'. The positive electrostatic surge does not cause any problem if a magnitude of voltage across the power source line 3 and the ground connection line 4 decreases. It is natural to design that the power source protection circuit 20 breaks down earlier than the NMOS 7$x$. The breakdown of the power source protection circuit 20 may not always occur before breakdown of the NMOS 7$x$, because an impedance of the power source line 3 and the ground connection line 4 up to the power source protection circuit 20 depends on a position of the power source protection circuit 20.

When a breakdown of the NMOS 7$x$ occurs earlier than a breakdown of the power source protection circuit 20, a positive electrostatic surge current branches into the NMOS 7$a$ and the NMOS 7$b$. The NMOS 7$a$ and the NMOS 7$b$ are respectively connected to the protection resistors 11$a$ and 11$b$ in series each other which have relatively large resistance. A current flowing in each of the NMOS 7$a$ and the NMOS 7$b$ is relatively small. Thus, the current flowing through the NMOS 7$a$ and NMOS 7$b$ is about one half of a current flowing through the NMOS 7 in FIG. 1, the NMOS 7$a$ and NMOS 7$b$ are not broken immediately, and a magnitude of potential of the node NO rises up by a voltage drop which depends on the protection resistors 11$a$ and 11$b$.

If a breakdown of the power source protection circuit 20 occurs earlier than a breakdown of the NMOS 7$a$ and the NMOS 7$b$, a magnitude of voltage across the power source line 3 and the ground connection line 4 lowers rapidly, and the NMOS 7$a$ and the NMOS 7$b$ are protected or free from the electrostatic surge. Therefore, the load drive device has an improved electrostatic surge proof characteristic in comparison with the circuit of FIG. 1 and lower possibility of breakdown of the NMOS 7$a$ and the NMOS 7$b$.

In an operation of the NMOS 7$a$ and the NMOS 7$b$ as the output buffer in the load driving device according to the invention, the NMOS 7$a$ and the NMOS 7$b$ having gates with a relatively small gate width are coupled between the output node NO and the ground connection line 4. Furthermore, the protection resistors 11$a$ and 11$b$ having relatively large resistances are connected between the output node NO and the ground connection line 4 through the NMOS 7$a$ and the NMOS 7$b$ in parallel. Therefore, the circuit of the invention has a driving ability which is similar to a conventional circuit. Since the load driving device of the invention does not need a protection resistor between a node NO and the output pad 8, the circuit of the invention can suppress voltage drop and power consumption of a protection resistor. In the embodiment described above, the load driving circuit according to the invention does not include a resistor which is connected to the output pad 8 in series, but it is obvious that a relatively small resistor may be connected to the output pad 8, if necessary.

The present invention is not be limited to the embodiment described above, but covers various modifications thereof. For example:
(1) In the illustrated embodiment the output buffer includes the NMOS 7$a$ and the NMOS 7$b$ which are juxtaposed, but the load driving device according to the invention may have more than three NMOSs which are connected in parallel with each other.
(2) The load driving device according to the present invention has a thyristor 21 and a PMOS 22 which controls a gate of the thyristor 21, but the load driving device according to the invention may have thyristor having an element which controls a gate of other thyristor.

This application is based on Japanese Patent Application No. 2005-260053 filed on Sep. 8, 2005, and the entire disclosure thereof is incorporated herein by reference.

What is claimed is:
1. A load driving device comprising:
a drive control signal generation circuit generating a load drive control signal; and
a semiconductor buffer circuit generating an output signal in response to said load drive control signal,
wherein said semiconductor buffer circuit includes
a pair of gate driven switching elements which are connected to each other in a push-pull configuration and driven by said load drive control signal,
an output terminal which is connected to a connection point between one controlled electrode of one of said pair of gate driven switching elements and one controlled electrode of an other of said pair of gate driven switching elements, and
a power source terminal and a ground connection terminal respectively connected to an other controlled electrode of said one of said pair of gate driven switching elements and an other controlled electrode of the other of said pair of gate driven switching elements,
wherein the other of the pair of gate driven switching elements includes a set of MOS transistors which are connected in parallel to each other and between said connection point and said ground connection terminal, and whose gates are driven by said load drive control signal.

2. The load driving device according to claim 1, wherein the other of the pair of gate driven switching elements has resistor elements respectively connected to said set of MOS transistors in series.

3. The load driving device according to claim 1, wherein said set of MOS transistors include a plurality of N-channel type MOS transistors formed on a semiconductor substrate.

4. The load driving device according to claim 1, wherein said drive control signal generation circuit is connected between a power source line and a ground connection line which are connected to said power source terminal and said ground connection terminal, respectively.

5. The load driving device according to claim 4, further comprising a power source protection circuit connected between said power source line and said ground connection line.

6. A load driving device comprising:
a first power supply line supplied with a first voltage level;
a second power supply line supplied with a second voltage level higher than the first voltage level;
an output terminal;
an internal circuit coupled between said first power supply line and said second power supply line, said internal circuit outputting a control signal;

a first MOS transistor having a first conductivity type, said first MOS transistor having a gate electrode for receiving the control signal, a first electrode coupled to said second power supply line, and a second electrode coupled to said output terminal;

a second MOS transistor having a second conductivity type, said second MOS transistor having a gate electrode for receiving the control signal, a first electrode coupled to said first power supply line, and a second electrode coupled to said output terminal via a first resistive element;

a third MOS transistor having the second conductivity type, said third MOS transistor having a gate electrode for receiving the control signal, a first electrode coupled to said first power supply line, and a second electrode coupled to said output terminal via a second resistive element.

7. The load driving device according to claim 6, further comprising:

a first diode having an anode coupled to said output terminal and a cathode coupled to said second power supply line;

a second diode having an anode coupled to said first power source line and a cathode coupled to said output terminal; and a protection circuit coupled between said first power supply line and said second power supply line.

8. The load driving device according to claim 6, wherein a gate width of said second MOS transistor is equal to a gate width of said third MOS transistor.

9. The load driving device according to claim 6, wherein a resistance value of said first resistive element is equal to a resistance value of said second resistive element.

10. The driving device according to claim 6, wherein each of said second and third MOS transistors comprises an offset type MOS transistor having drain and source regions with active regions that are a high diffusion area on a low diffusion area.

* * * * *